(12) United States Patent
Hsu

(10) Patent No.: US 10,381,792 B2
(45) Date of Patent: Aug. 13, 2019

(54) OUTLET DEVICE WITH VOICE CONTROL MODULE HAVING COUNTERWEIGHT PORTION

(71) Applicant: POWERTECH INDUSTRIAL CO., LTD., New Taipei (TW)

(72) Inventor: Jung-Hui Hsu, New Taipei (TW)

(73) Assignee: POWERTECH INDUSTRIAL CO., LTD., New Taipei, Taiwan (TW)

( * ) Notice: Subject to any disclaimer, the term of this patent is extended or adjusted under 35 U.S.C. 154(b) by 0 days.

(21) Appl. No.: 15/792,830

(22) Filed: Oct. 25, 2017

(65) Prior Publication Data

US 2018/0115108 A1 Apr. 26, 2018

(30) Foreign Application Priority Data

Oct. 26, 2016 (TW) .............................. 105134550 A

(51) Int. Cl.
| | |
|---|---|
| *H01R 25/00* | (2006.01) |
| *H01R 24/66* | (2011.01) |
| *H02G 3/08* | (2006.01) |
| *G05B 13/02* | (2006.01) |
| *G10L 15/22* | (2006.01) |

(Continued)

(52) U.S. Cl.
CPC ........... *H01R 25/006* (2013.01); *G05B 13/02* (2013.01); *G10L 15/22* (2013.01); *H01R 13/6395* (2013.01); *H01R 13/6675* (2013.01); *H01R 13/6683* (2013.01); *H01R 13/73* (2013.01); *H01R 24/66* (2013.01); *H01R 24/76* (2013.01); *H01R 25/003* (2013.01); *H01R 35/02* (2013.01); *H02G 3/081* (2013.01); *H05K 7/20145* (2013.01); *G10L 2015/223* (2013.01); *H01R 13/70* (2013.01); *H01R 24/62* (2013.01); *H01R 2103/00* (2013.01); *H02G 3/18* (2013.01)

(58) Field of Classification Search
CPC . H01R 25/006; H01R 9/0518; H01R 13/6395
USPC ................................................ 439/585, 535
See application file for complete search history.

(56) References Cited

U.S. PATENT DOCUMENTS 2,271,463 A * 1/1942 Reeves .................... D06F 81/00
248/51
5,086,385 A * 2/1992 Launey ............... G06F 3/04847
340/6.11

(Continued)

*Primary Examiner* — Tulsidas C Patel
*Assistant Examiner* — Peter G Leigh
(74) *Attorney, Agent, or Firm* — Li & Cai Intellectual Property (USA) Office

(57) ABSTRACT

An outlet device includes a counterweight portion, a hanging portion arranged distant from the counterweight portion, an extending portion having two ends respectively connected to the counterweight portion and the hanging portion, a voice controlling module installed in the hanging portion, and a power cord connected to the counterweight portion. The outlet unit of the counterweight portion and the voice controlling module are electrically connected to the power cord. The voice controlling module is to receive voice signal for controlling a corresponding electronic device. When the outlet device is applied to a plate, the counterweight portion is arranged under the plate and the hanging portion is arranged on the plate, and the hanging portion remains hung on the plate by using the weight distribution of the outlet device, thereby maintaining the outlet device in a static balance state.

9 Claims, 17 Drawing Sheets

(51) Int. Cl.
*H01R 13/639* (2006.01)
*H01R 13/66* (2006.01)
*H01R 24/76* (2011.01)
*H01R 35/02* (2006.01)
*H05K 7/20* (2006.01)
*H01R 13/73* (2006.01)
*H01R 103/00* (2006.01)
*H02G 3/18* (2006.01)
*H01R 13/70* (2006.01)
*H01R 24/62* (2011.01)

(56) References Cited

U.S. PATENT DOCUMENTS

| | | | | |
|---|---|---|---|---|
| 6,004,157 | A * | 12/1999 | Glass | A47B 21/06 439/535 |
| 6,540,554 | B2 * | 4/2003 | McCarthy | H01R 13/73 439/574 |
| 6,642,450 | B1 * | 11/2003 | Hsiao | H01R 25/006 174/480 |
| 7,083,421 | B1 * | 8/2006 | Mori | H01R 13/46 439/574 |
| 7,139,716 | B1 * | 11/2006 | Gaziz | H04L 12/2803 704/275 |
| 7,223,122 | B2 * | 5/2007 | Mori | H01R 13/447 439/501 |
| 7,485,804 | B2 * | 2/2009 | Dinh | H02G 3/123 174/480 |
| 7,938,679 | B2 * | 5/2011 | Wadsworth | H01R 13/74 439/574 |
| 8,027,752 | B2 * | 9/2011 | Castaldo | G06F 9/54 700/296 |
| 8,469,748 | B2 * | 6/2013 | Chambers | H01R 13/005 439/577 |
| 9,161,464 | B2 * | 10/2015 | Liao | H05K 5/0065 |
| 9,462,340 | B1 * | 10/2016 | Mathurin | H04N 21/234336 |
| 2003/0092297 | A1 * | 5/2003 | Reindle | H01R 31/02 439/107 |
| 2003/0176100 | A1 * | 9/2003 | Yurek | H01R 27/00 439/535 |
| 2009/0137163 | A1 * | 5/2009 | Schoettle | H01R 13/66 439/894 |
| 2012/0253824 | A1 * | 10/2012 | Alcantara Talavera | H04M 11/007 704/275 |
| 2014/0163751 | A1 * | 6/2014 | Davis | H04L 12/12 700/286 |
| 2014/0244267 | A1 * | 8/2014 | Levi | G10L 15/22 704/275 |
| 2014/0349269 | A1 * | 11/2014 | Canoy | G06N 99/005 434/322 |
| 2014/0358553 | A1 * | 12/2014 | Helmke | G10L 15/22 704/275 |
| 2014/0362559 | A1 * | 12/2014 | Chien | H02G 3/14 362/95 |
| 2014/0376747 | A1 * | 12/2014 | Mullet | G08C 23/00 381/110 |
| 2015/0005900 | A1 * | 1/2015 | Steele | G05B 15/02 700/19 |
| 2015/0009652 | A1 * | 1/2015 | Alexander | H01R 35/04 362/95 |
| 2015/0092608 | A1 * | 4/2015 | Gossain | H04W 52/0212 370/256 |
| 2015/0118896 | A1 * | 4/2015 | Shomali | H01R 13/5224 439/540.1 |
| 2015/0154976 | A1 * | 6/2015 | Mutagi | H04L 12/281 704/275 |
| 2015/0281815 | A1 * | 10/2015 | Rip | H04R 1/028 381/334 |
| 2015/0324706 | A1 * | 11/2015 | Warren | H04L 12/2803 700/275 |
| 2016/0170017 | A1 * | 6/2016 | Ho | G08B 13/1645 342/53 |
| 2016/0218884 | A1 * | 7/2016 | Ebrom | D06F 33/02 |

* cited by examiner

OUTLET DEVICE WITH VOICE CONTROL MODULE HAVING COUNTERWEIGHT PORTION

BACKGROUND OF THE INVENTION

1. Field of the Invention

The present disclosure relates to an outlet; in particular, to an outlet device for hanging on a plate.

2. Description of Related Art

The structure of a conventional outlet device has not undergone any significant change in recent years, thus limiting the functions thereof. For example, when the conventional outlet device is applied to a desk, the conventional outlet device does not have any additional function other than the function of supplying power.

SUMMARY OF THE INVENTION

The present disclosure provides an outlet device to solve the drawback associated with conventional outlet devices.

The present disclosure provides an outlet device for being hung on a plate, in which the outlet device includes a counterweight portion, a hanging portion, an extending portion, a voice controlling module, and a power cord. The counterweight portion includes an outlet unit. The hanging portion is arranged distant from the counterweight portion. The extending portion has two opposite ends respectively connected to the counterweight portion and the hanging portion. A free end of the hanging portion is arranged distant from the extending portion by a lateral distance, the extending portion has a width parallel to the lateral distance, and the width is less than or equal to the lateral distance. The voice controlling module includes a voice receiver installed to the hanging portion for receiving a voice signal. The voice controlling module is configured to control an electronic device according to the voice signal received from the voice receiver. The power cord is electrically connected to the outlet unit and the voice controlling module. The power cord has an end connected to the counterweight portion and an opposite end used for detachably inserting into an external power supplying outlet. When the outlet device is applied to the plate, the counterweight portion is arranged under the plate and the hanging portion is arranged on the plate, and the hanging portion remains hung on the plate by using the weight distribution of the outlet device, thereby maintaining the outlet device in a static balance state.

The present disclosure also provides an outlet device, which includes a counterweight portion, a hanging portion, an extending portion, and a voice controlling module. The hanging portion is arranged distant from the counterweight portion. At least one of the counterweight portion and the hanging portion is provided with an outlet unit. The extending portion has two opposite ends respectively connected to the counterweight portion and the hanging portion. The voice controlling module includes a voice receiver installed in the hanging portion or the extending portion for receiving a voice signal. The voice controlling module is configured to control an electronic device according to the voice signal received from the voice receiver.

The present disclosure further provides an outlet device, which includes a counterweight portion, a hanging portion, an extending portion, an AC/DC convertor, a wireless controller, and a speaker. The hanging portion is arranged distant from the counterweight portion. At least one of the counterweight portion and the hanging portion is provided with an outlet unit. The extending portion has two opposite ends respectively connected to the counterweight portion and the hanging portion. The AC/DC convertor and the wireless controller are electrically connected to each other. The speaker is electrically connected to the AC/DC convertor and the wireless controller. The wireless controller is configured to control the speaker by receiving an external signal, and the speaker, the AC/DC convertor, and the wireless controller are installed in at least one of the counterweight portion, the hanging portion, and the extending portion.

In summary, the outlet device of the present disclosure is provided to wirelessly control an electronic device or a speaker (i.e., the electronic device is controlled by the voice controlling module, or the speaker is controlled by the wireless controller), thereby increasing the value added of the outlet device. Moreover, the voice controlling module of the outlet device can be wirelessly connected to the expansion outlets, such that a user can control the expansion outlets by speaking to the voice controlling module.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

Figure 1:
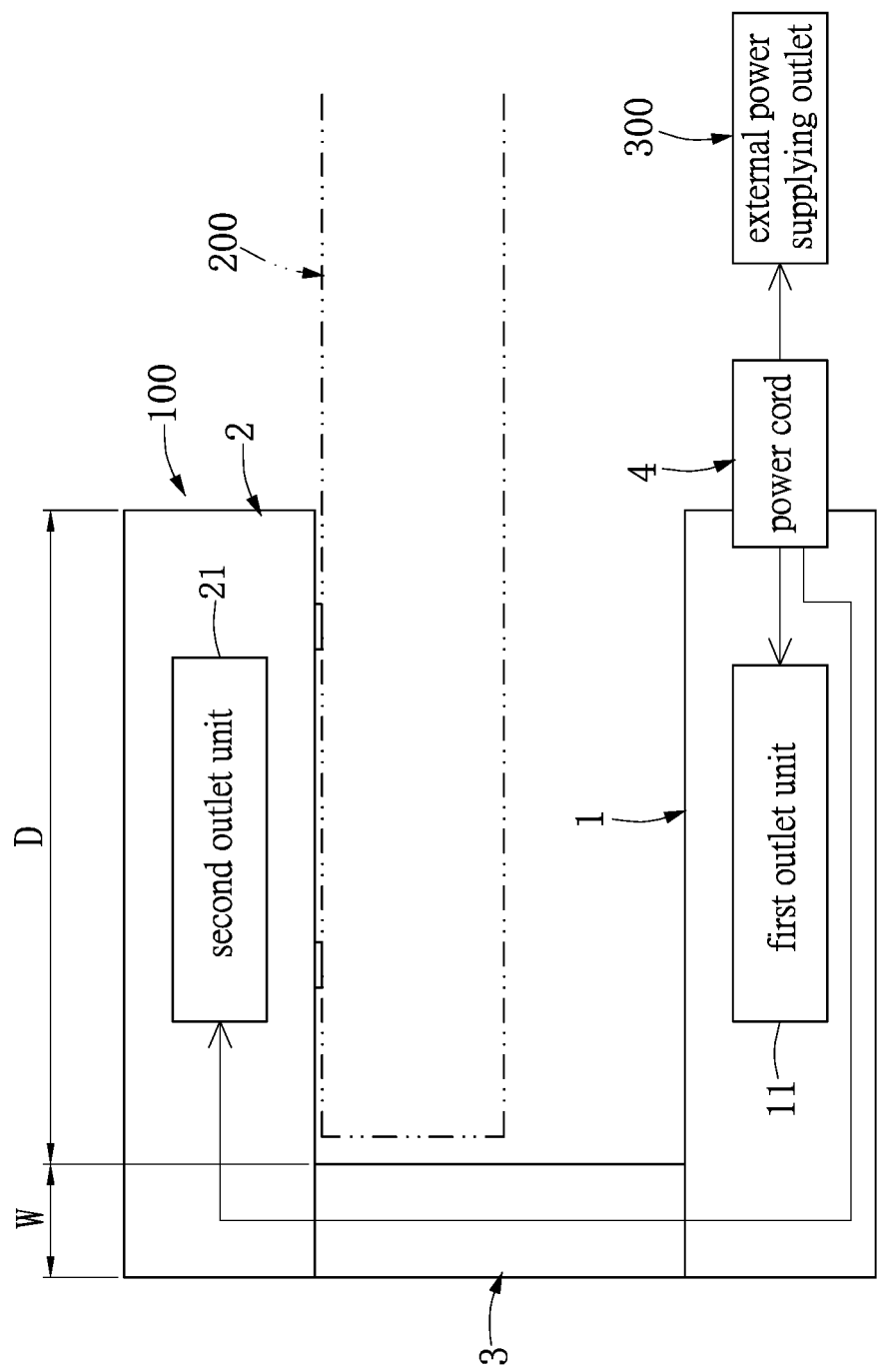
FIG. 1 is a schematic view showing an outlet device hanging on a plate and electrically connected to a power supplying outlet according to the present disclosure.

Reference is made to FIGS. 1 to 17. FIG. 1 illustrates a schematic view of the present disclosure, and FIGS. 2 to 17 illustrate five embodiments of the present disclosure. References are hereunder made to the detailed descriptions and appended drawings in connection with the present disclosure. However, the appended drawings are merely provided for exemplary purposes, and should not be construed as restricting the scope of the present disclosure.

As shown in FIG. 1, the present disclosure provides an outlet device 100 for being hung on a plate 200 (e.g., a desk, an office table, or a counter), but the present disclosure is not limited thereto. The outlet device 100 includes a counterweight portion 1, a hanging portion 2 arranged distant from the counterweight portion 1, an extending portion 3 connected to the counterweight portion 1 and the hanging portion 2, and a power cord 4 connected to the counterweight portion 1.

Specifically, the extending portion 3 has two opposite ends (i.e., the bottom end and the top end of the extending portion 3 as shown in FIG. 1) respectively connected to the counterweight portion 1 and the hanging portion 2. The connection of the extending portion 3 and the counterweight portion 1 (or the hanging portion 2) can be, but is not limited to, an integral connection, a detachable connection, a slidable connection, or a rotatable connection.

Moreover, the counterweight portion 1 includes a first outlet unit 11, and the hanging portion 2 includes a second outlet unit 21. The outlet device 100 is configured to hang on the plate 200 by adjusting the weight distribution of the counterweight portion 1, the hanging portion 2, and the extending portion 3. The outlet device 100 can be firmly hung on the plate 200 by adjusting the size proportion of the hanging portion 2 and the extending portion 3. For example, a free end of the hanging portion 2 (i.e., the right end of the hanging portion 2 as shown in FIG. 1) is arranged distant from the extending portion 3 by a lateral distance D, the extending portion 3 has a width W parallel to the lateral distance D, and the width W is less than or equal to the lateral distance D.

The power cord 4 has an end connected to the counterweight portion 1 and an opposite end used for detachably inserting into an external power supplying outlet 300. The power cord 4 is electrically connected to the first outlet unit 11 and the second outlet unit 21, thereby transmitting power from the external power supplying outlet 300 to the first outlet unit 11 and the second outlet unit 21. The connection of the power cord 4 and the counterweight portion 1 can be, but is not limited to, a fixed connection, a detachable connection, or a rotatable connection.

Accordingly, the outlet device 100 is configured to arrange the counterweight portion 1 under the plate 200 and to arrange the hanging portion 2 on the plate 200, and the hanging portion 2 remains hung on the plate 200 by using the weight distribution of the outlet device 100, thereby maintaining the outlet device 100 in a static balance state. Thus, the outlet device 100 of the present disclosure can satisfy a condition where an outlet under the plate 200 and an outlet on the plate 200 are needed at the same time by disposing the hanging portion 2 on the plate 200 to provide the first outlet unit 11 under the plate 200 and the second outlet unit 21 above the plate 200.

The common features of the outlet device 100 of the present disclosure have been disclosed in the above description, and a designer can use the above common features to form different embodiments of the outlet device 100. However, since the present disclosure cannot disclose all possible embodiments of the outlet device 100, the following description only describes some embodiments of the outlet device 100, but the present disclosure is not limited thereto.

[First Embodiment]

Figure 2:
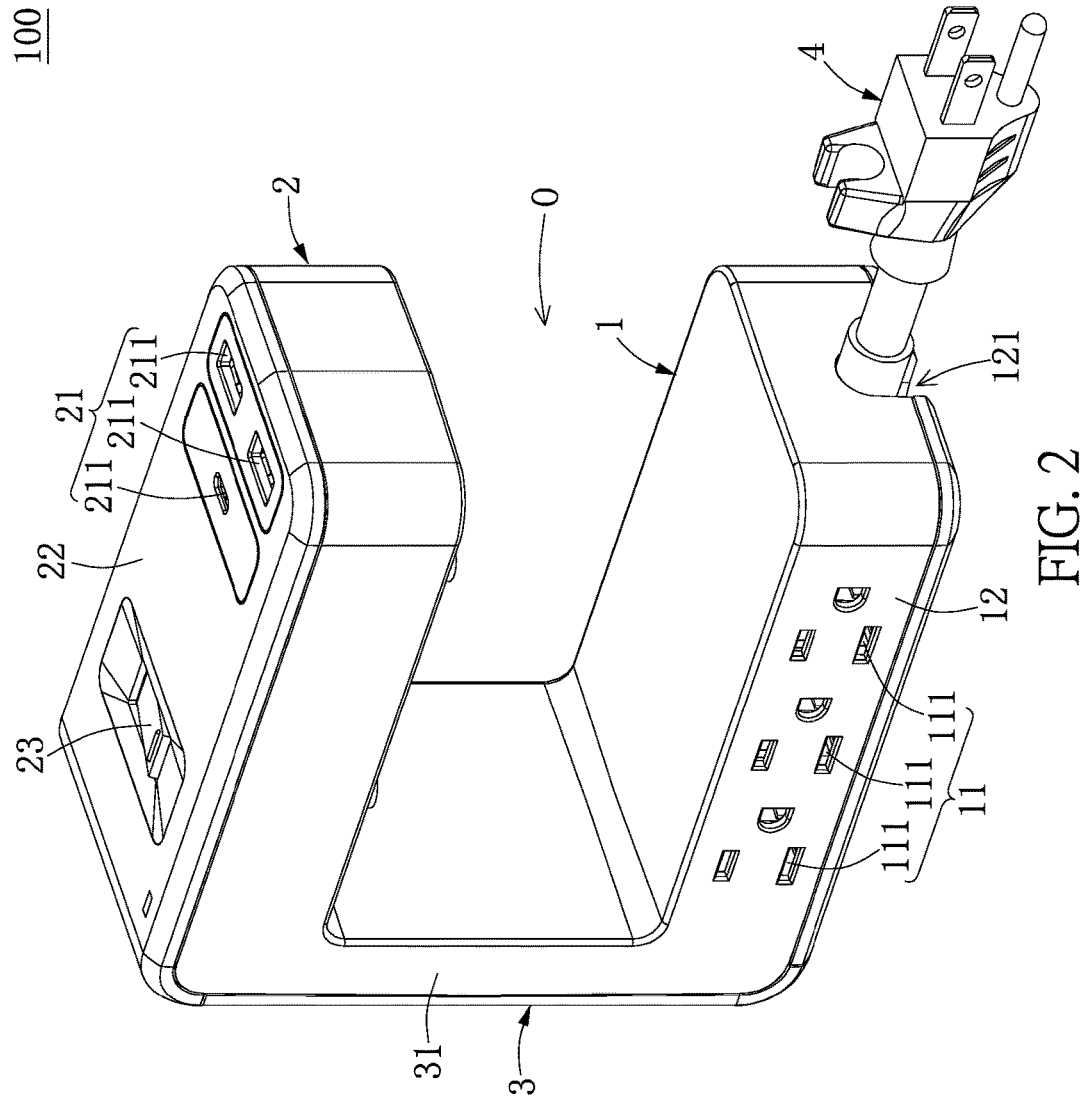
FIG. 2 is a perspective view showing the outlet device according to a first embodiment of the present disclosure.
Figure 3:
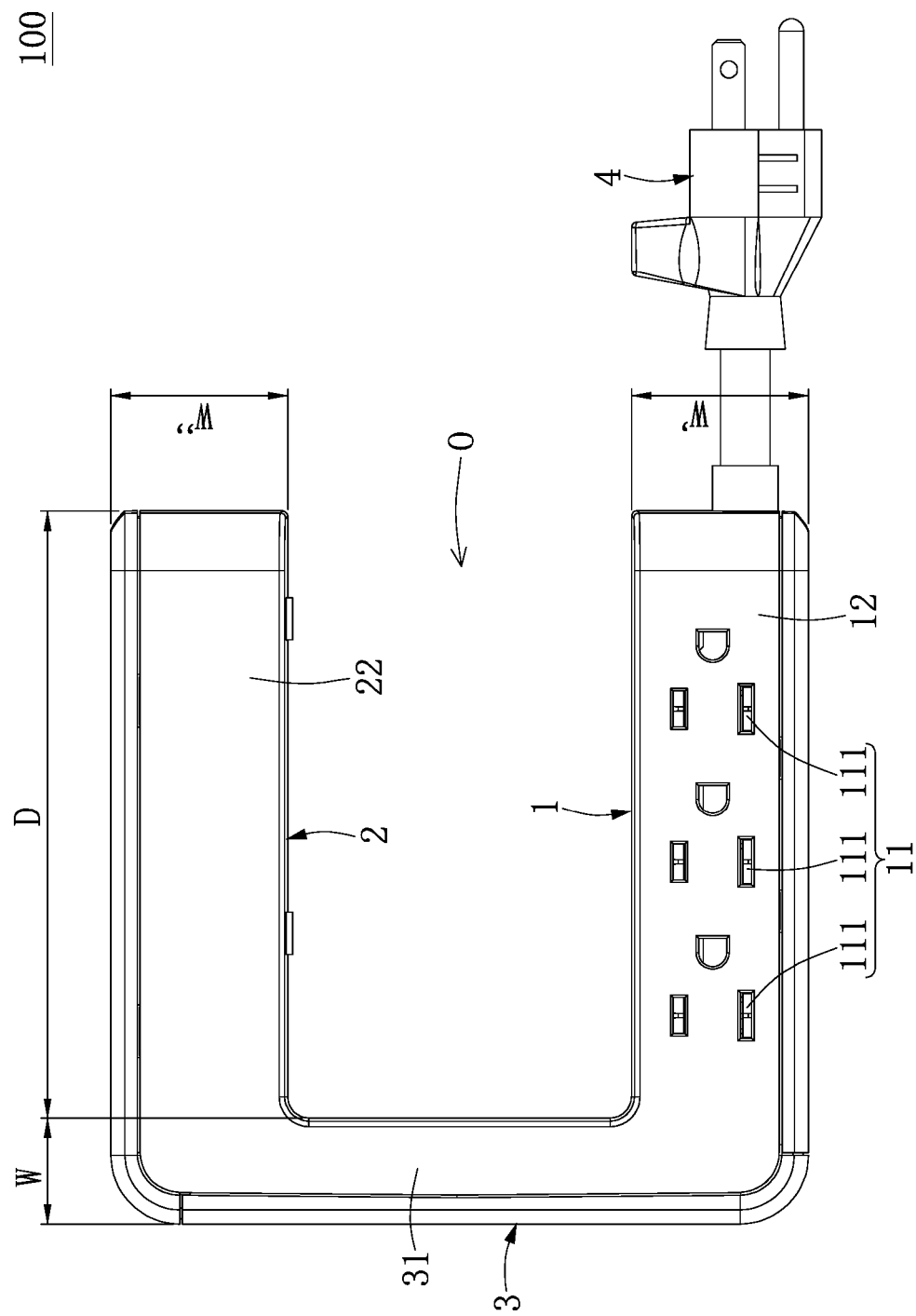
FIG. 3 is a planar view of FIG. 2.
Figure 4:
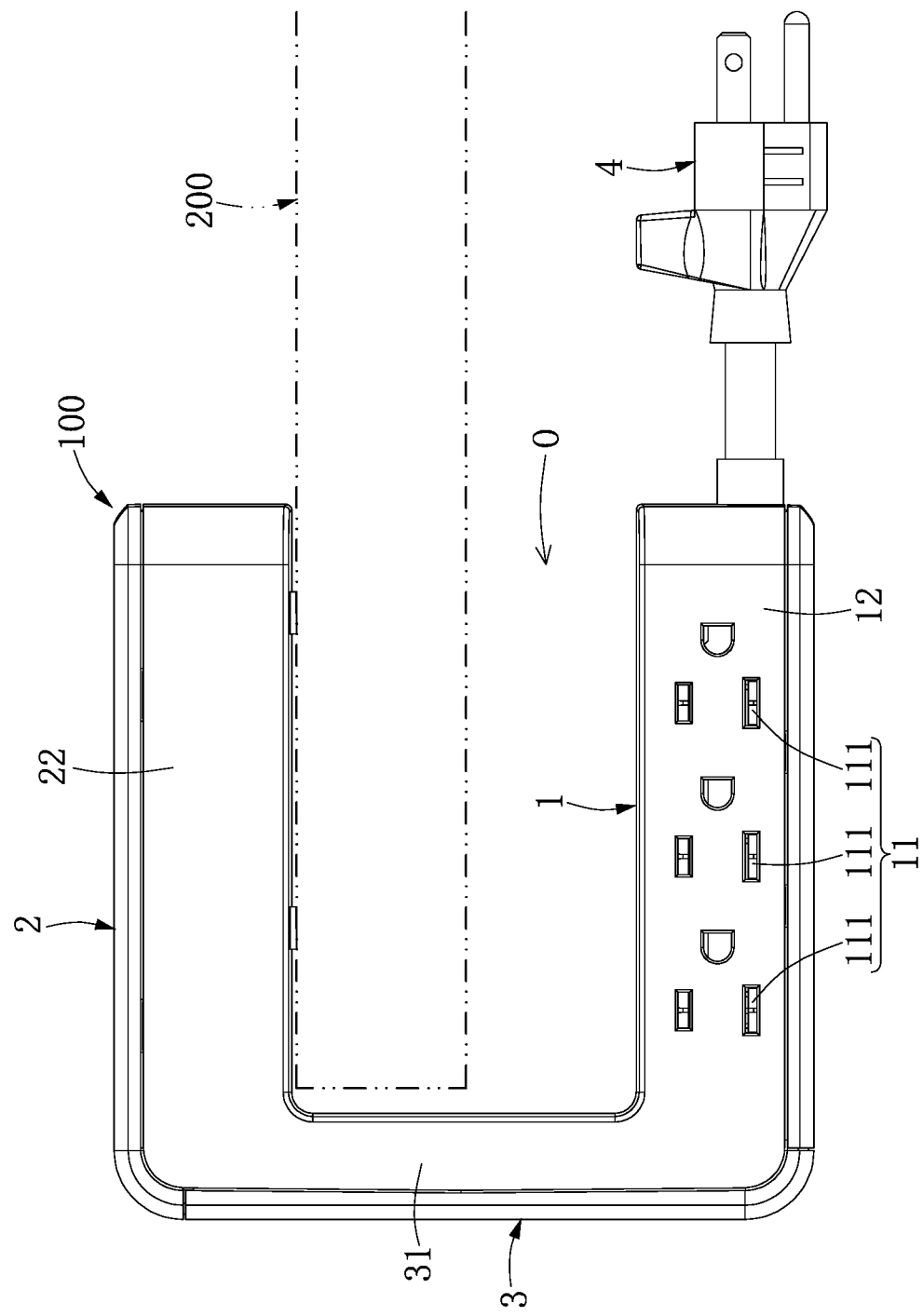
FIG. 4 is a planar view showing the outlet device of FIG. 2 hanging on a plate.

Reference is made to FIGS. 2 to 4, which illustrate a first embodiment of the present disclosure. The difference between the first embodiment and the above common features is disclosed as follows.

The counterweight portion 1 includes a first case 12, and the first outlet unit 11 is disposed in the first case 12. In other words, the first case 12 and the components arranged in the first case 12 in the present embodiment are co-defined as the counterweight portion 1. The first outlet unit 11 includes at least one AC power outlet 111, and an opening of the at least one AC power outlet 111 is arranged on a surface of the counterweight portion 1 (i.e., a side surface of the first case 12 as shown in FIG. 2) which does not face the hanging portion 2, but the present disclosure is not limited thereto.

The hanging portion 2 includes a second case 22, and the second outlet unit 21 is disposed in the second case 22. In other words, the second case 22 and the components arranged in the second case 22 in the present embodiment are co-defined as the hanging portion 2. The second outlet unit 21 includes at least one DC power outlet 211 (i.e., a USB outlet), and an opening of the at least one DC power outlet 211 is formed on a surface of the hanging portion 2 (i.e., a top surface of the second case 22 as shown in FIG. 2) which is arranged distant from the counterweight portion 1, but the present disclosure is not limited thereto.

Moreover, the hanging portion 2 in the present embodiment further includes a switch unit 23 for controlling the second outlet unit 21 and/or the first outlet unit 11 to supply electricity. The switch unit 23 is disposed on the surface of the hanging portion 2 (i.e., the top surface of the second case 22 as shown in FIG. 2) which is arranged distant from the counterweight portion 1, so that a user can conveniently operate the switch unit 23.

The extending portion 3 includes a third case 31. The third case 31 and the components arranged in the third case 31 in the present embodiment are co-defined as the extending portion 3, and the extending portion 3 in the present embodiment is preferably provided without any outlet unit. The third case 31 has a first end and an opposite second end, and the first end and the second end are respectively and perpendicularly connected to the first case 12 and the second case 22. Specifically, the first end of the third case 31 (i.e., the bottom end of the third case 31 as shown in FIG. 3) is integrally connected to the first case 12, and the second end of the third case 31 (i.e., the top end of the third case 31 as shown in FIG. 3) is integrally connected to the second case 22.

The length of the first case 12 in the present embodiment is substantially equal to that of the second case 22. The first case 12, the second case 22, and the third case 31 jointly define a U-shaped hanging slot O. Moreover, the width W' of the first case 12 is substantially equal to the width W''' of the second case 22, and the width W of the third case 31 is smaller than the width W' of the first case 12.

In addition, a corner of the first case 12 (i.e., the right-lower corner of the first case 12 as shown in FIG. 2) arranged distant from the third case 31 has a notch 121, and the power cord 4 is rotatable to be arranged in the notch 121 of the first case 12, so that a user can conveniently adjust the position of the power cord 4.

It should be noted that the terms "first", "second", and "third" in the present embodiment are used to distinguish different components from each other and do not have physical meanings, in other words, the terms "first", "second", and "third" in the present embodiment can be omitted. For example, the first outlet unit 11 or the second outlet unit 21 can be named as an outlet unit.

[Second Embodiment]

Figure 5:
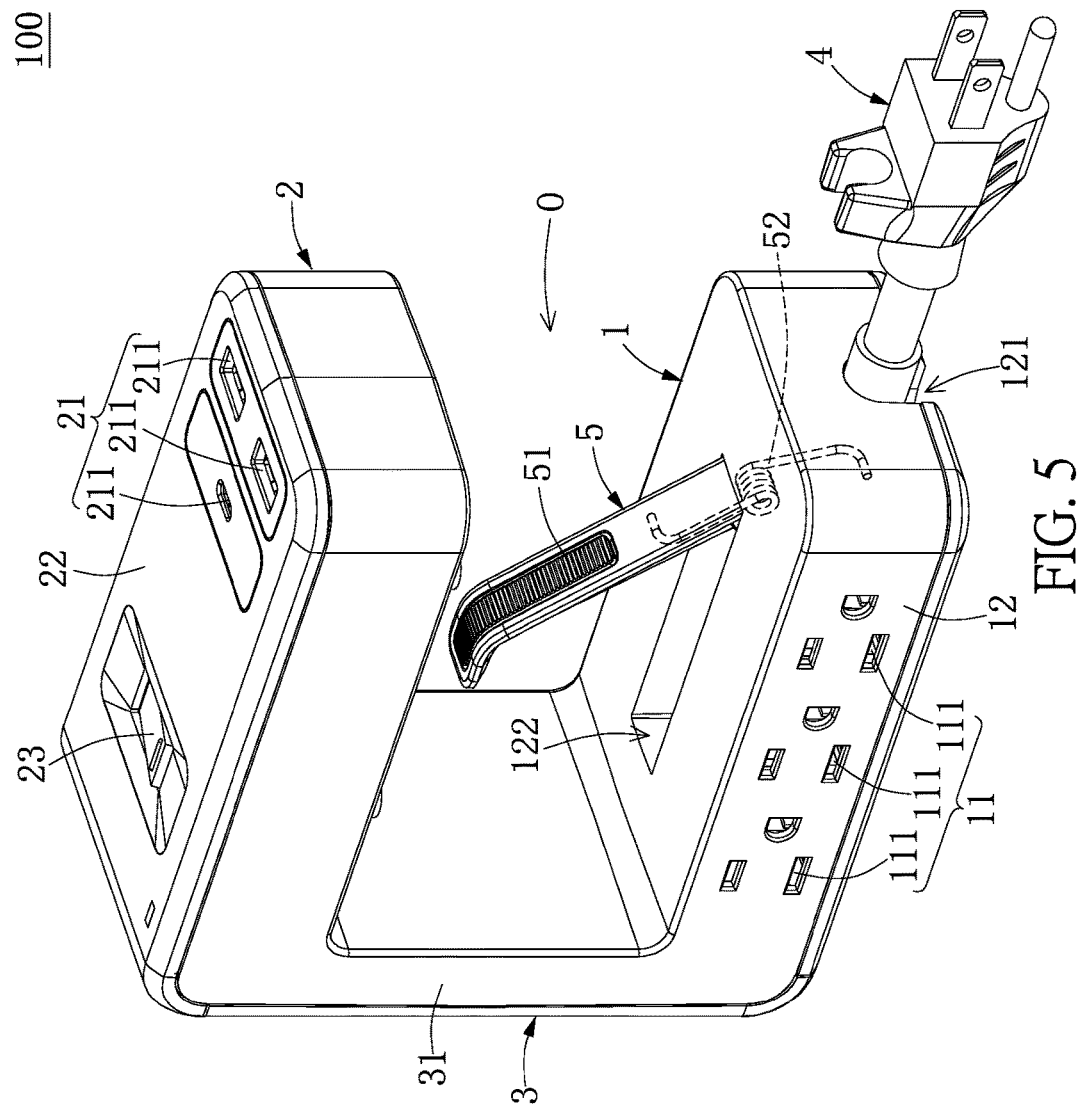
FIG. 5 is a perspective view showing the outlet device according to a second embodiment of the present disclosure.
Figure 6:
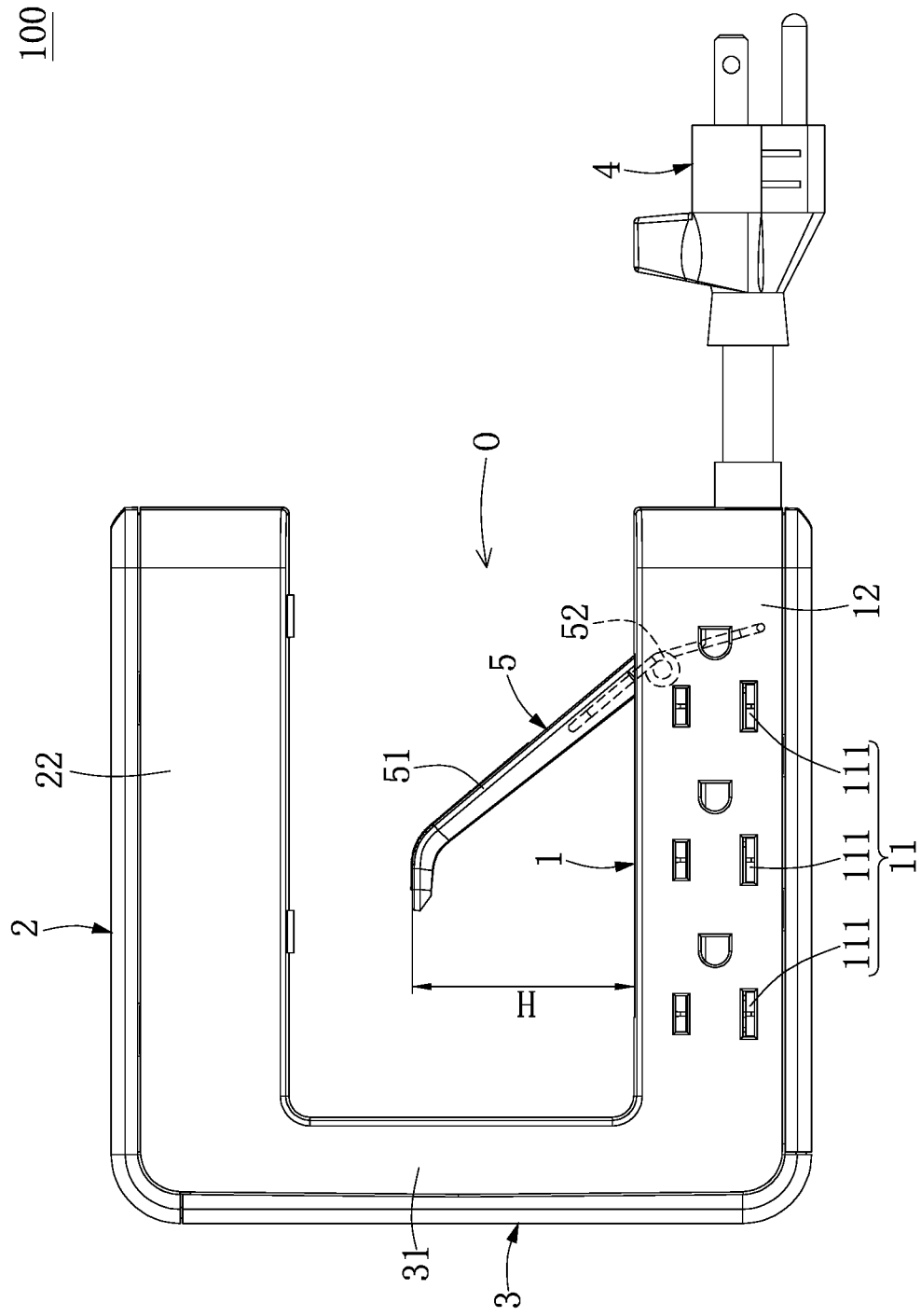
FIG. 6 is a planar view of FIG. 5.
Figure 7:
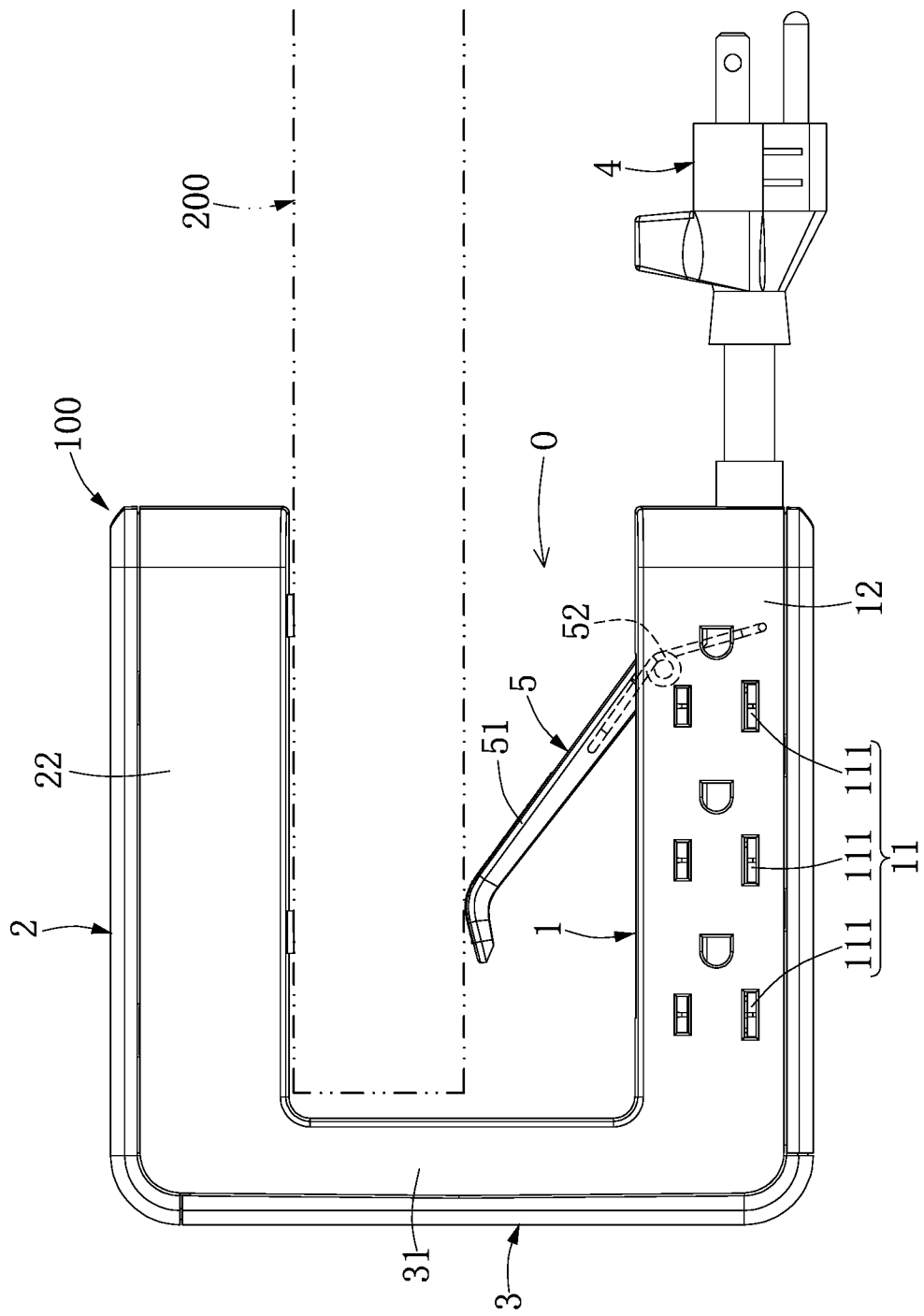
FIG. 7 is a planar view showing the outlet device of FIG. 5 hanging on a plate.

Reference is made to FIGS. 5 to 7, which illustrate a second embodiment of the present disclosure. The difference between the second embodiment and the first embodiment is disclosed as follows.

The outlet device 100 of the present embodiment further includes a limiting structure 5 movably disposed on the first case 12. The limiting structure 5 is arranged in the U-shaped hanging slot O for abutting against the plate 200. The following description discloses the features of the limiting structure 5, but the present disclosure is not limited thereto.

The limiting structure 5 includes an abutting member 51 and an elastic member 52 (i.e., a torsion spring). An end of the abutting member 51 (i.e., the bottom end of the abutting member 51 as shown in FIG. 6) is disposed on (i.e., pivotally connected to) the first case 12 by cooperating with the elastic member 52, and an opposite end of the abutting member 51 (i.e., the top end of the abutting member 51 as shown in FIG. 6) is arranged away from the first case 12 by a vertical distance H. Specifically, a distance between the abutting member 51 and the first case 12 is gradually increased in a direction from bottom to top (i.e., a direction from right side to left side as shown in FIG. 6), and the vertical distance H is the maximum distance between the abutting member 51 and the first case 12.

Moreover, an accommodating slot 122 is recessed in an inner surface of the first case 12 (i.e., a surface of the first case 12 faces the second case 22) and is in air communication with the U-shaped hanging slot O. The accommodating slot 122 is configured to receive the limiting structure 5, and the abutting member 51 of the limiting structure 5 is movable toward (or movable into) the accommodating slot 122 when being pressed.

In more detail, when the abutting member 51 is pressed to cause reduction of the vertical distance H, that is to say, the top end of the abutting member 51 as shown in FIG. 7 moves toward the accommodating slot 122, the elastic member 52 stores an elastic force tending to recover the vertical distance H, so that the abutting member 51 can abut against the plate 200 by the elastic force generated from the elastic member 52.

[Third Embodiment]

Reference is made to FIGS. 8 to 12, which illustrate a third embodiment of the present disclosure. The difference between the third embodiment and the first embodiment is disclosed as follows.

Figure 8:
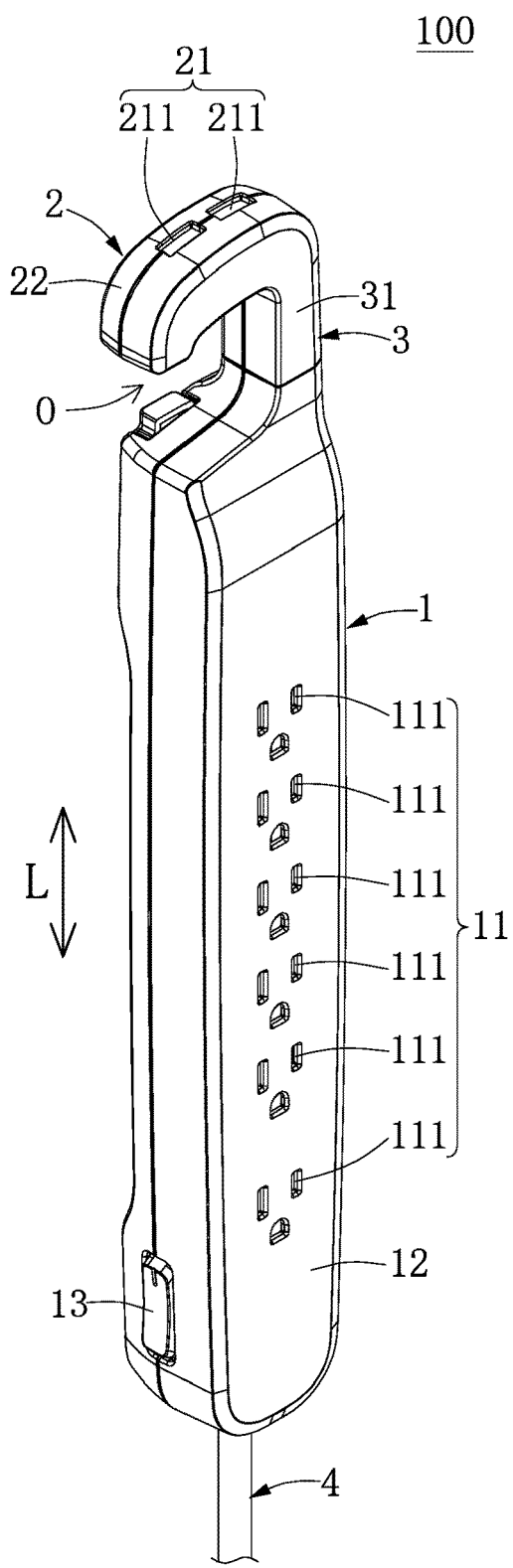
FIG. 8 is a perspective view showing the outlet device according to a third embodiment of the present disclosure.
Figure 9:
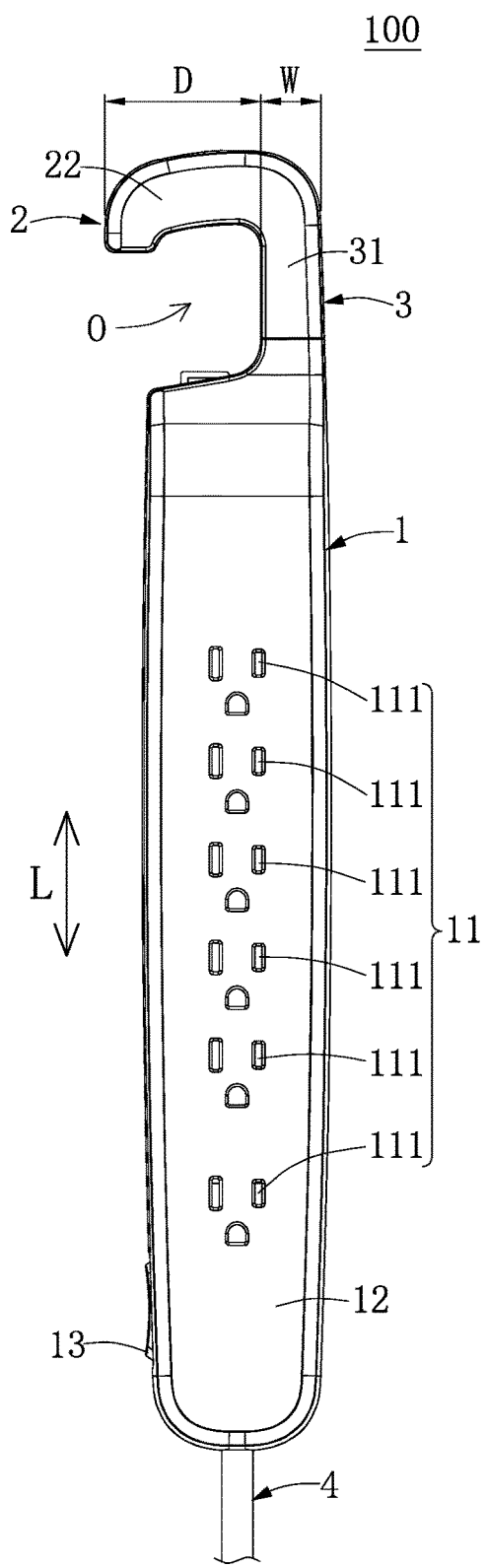
FIG. 9 is a planar view of FIG. 8.
Figure 10:
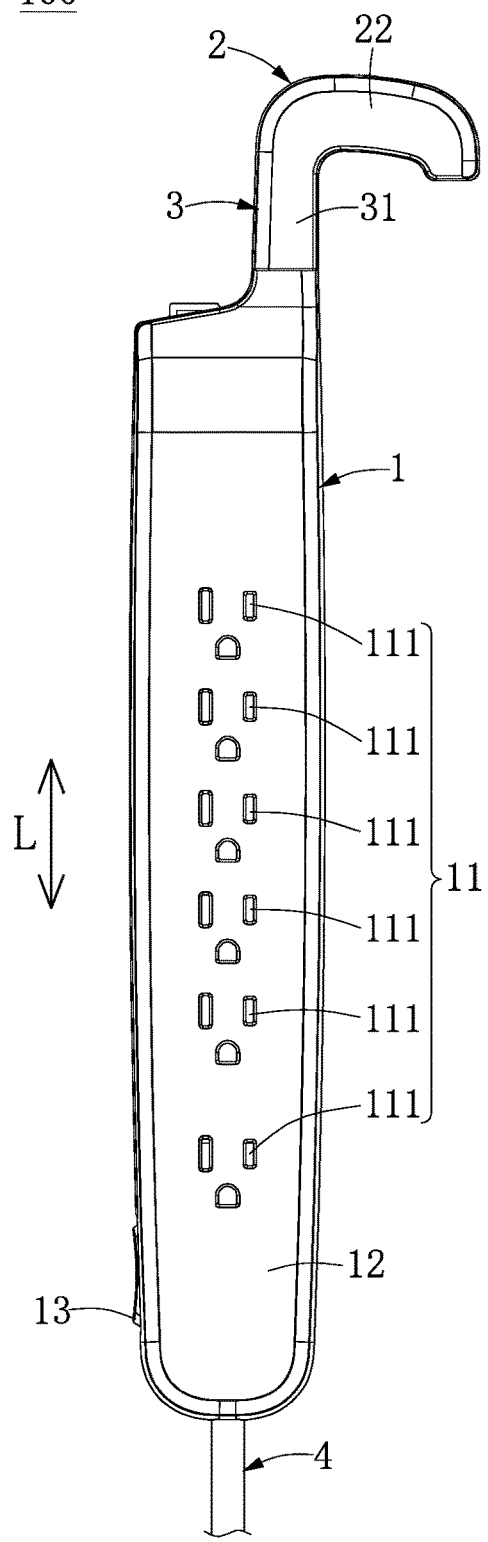
FIG. 10 is a planar view showing that the counterweight portion and the extending portion of FIG. 8 are rotatable relative to each other.
Figure 11:
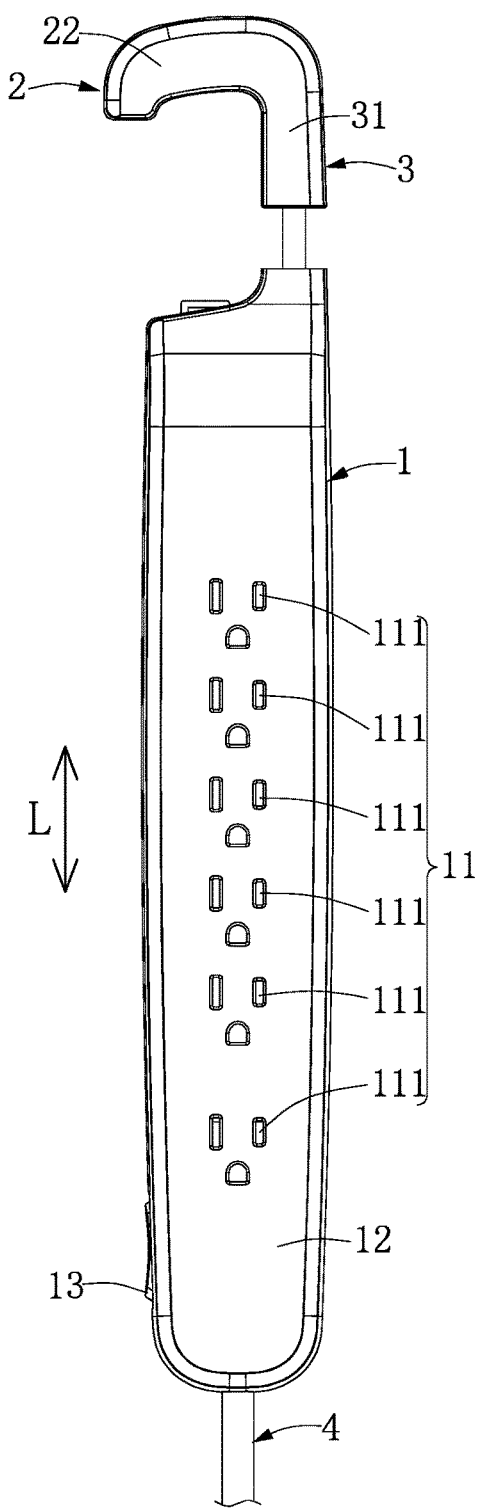
FIG. 11 is a planar view showing that the counterweight portion and the extending portion of FIG. 8 are retractable relative to each other.
Figure 12:
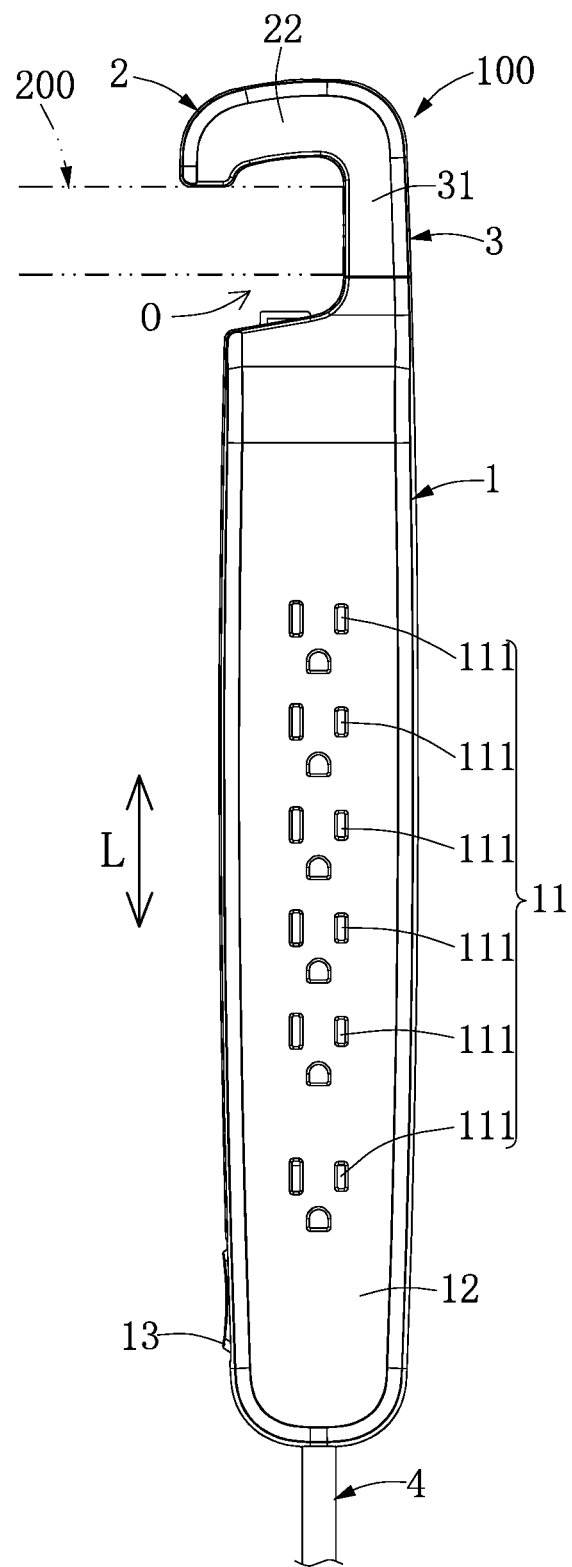
FIG. 12 is a planar view showing the outlet device of FIG. 8 hanging on a plate.

In the present embodiment, the first case 12 having an elongated shape defines a longitudinal direction L, which is perpendicular to the lateral direction D and the width W. The first end of the third case 31 (i.e., the bottom end of the third case 31 as shown in FIGS. 8 and 9) is movably connected to the first case 12, and the second end of the third case 31 (i.e., the top end of the third case 31 as shown in FIGS. 8 and 9) is integrally connected to the second case 22. Moreover, the connection of the first end of the third case 31 and the first case 12 in the present embodiment can be, but is not limited to, a rotatable connection as shown in FIG. 10 or a retractable connection as shown in FIG. 11.

Specifically, the first outlet unit 11 includes a plurality of AC power outlets 111 arranged in one row parallel to the longitudinal direction L. The counterweight portion 1 has a switch unit 13 disposed on a bottom of the first case 12 for controlling the first outlet unit 11 and/or the second outlet unit 21 to supply electricity. The hanging portion 2 in the present embodiment is provided without any switch unit. Moreover, the power cord 4 is connected to an end of the counterweight portion 1 (i.e., the bottom end of the first case 12 as shown in FIG. 9) arranged distant from the hanging portion 2.

[Fourth Embodiment]

Figure 13:
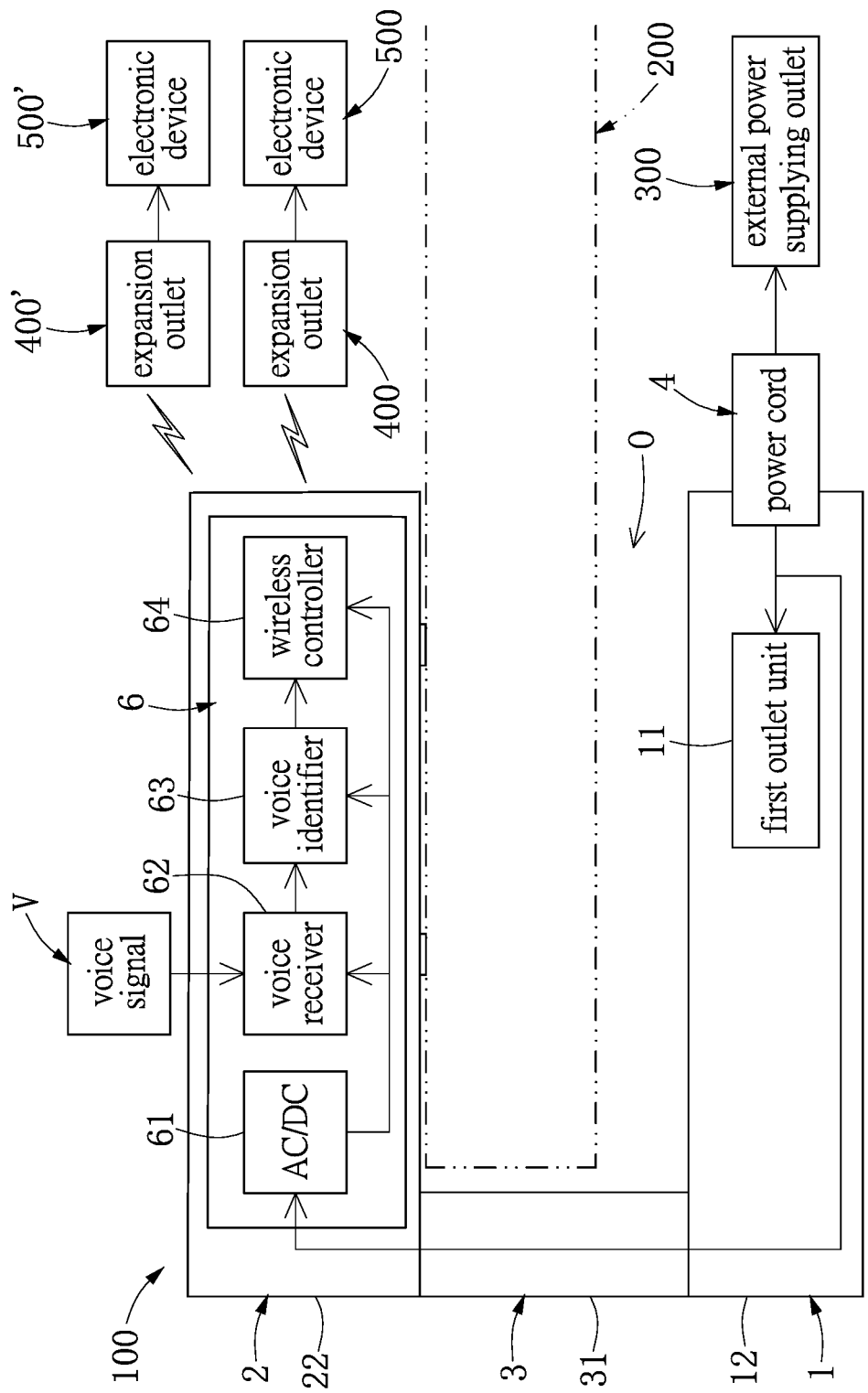
FIG. 13 is a first schematic view showing the outlet device according to a fourth embodiment of the present disclosure.
Figure 14:
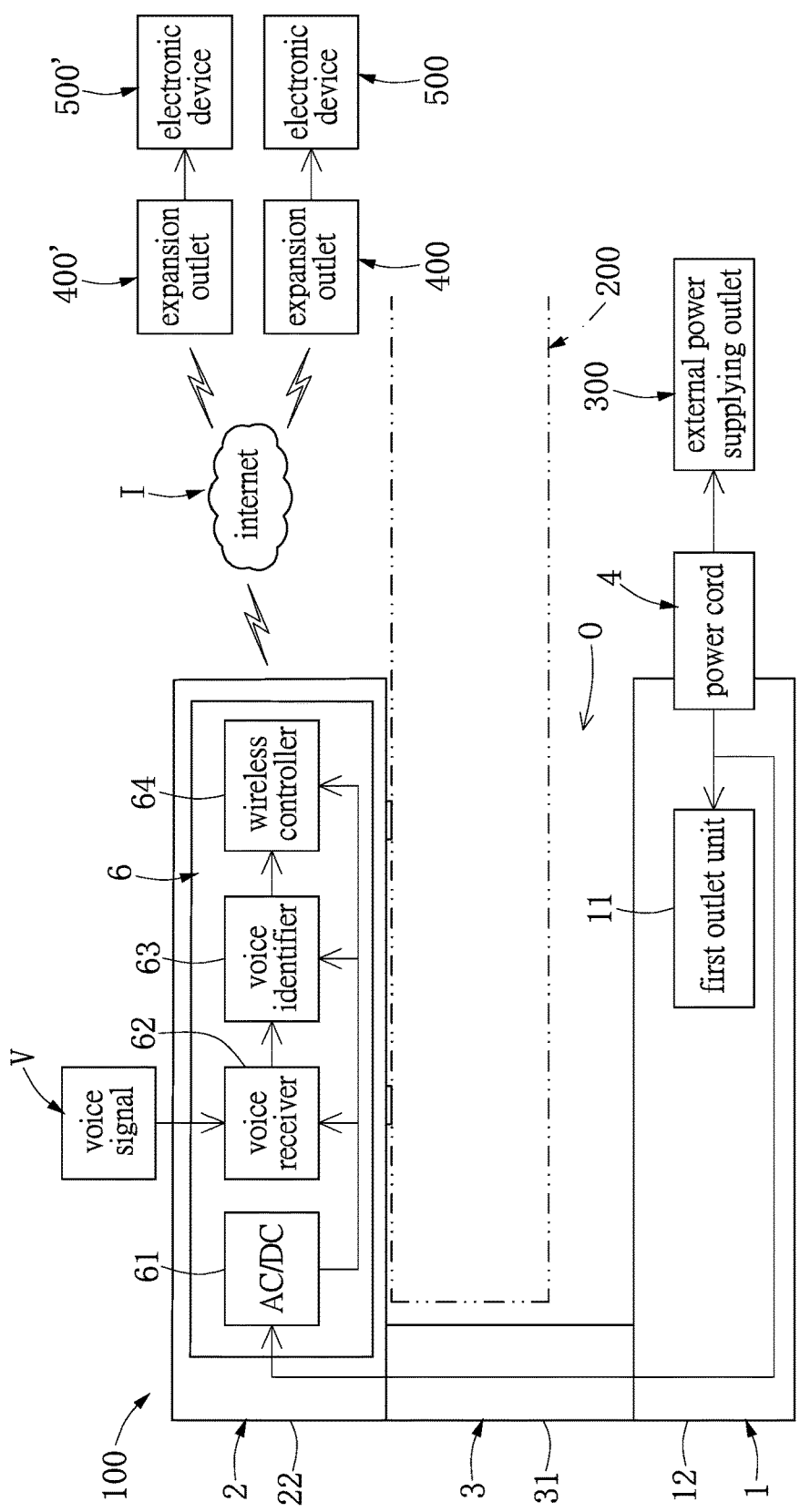
FIG. 14 is a second schematic view showing the outlet device according to the fourth embodiment of the present disclosure.
Figure 15:
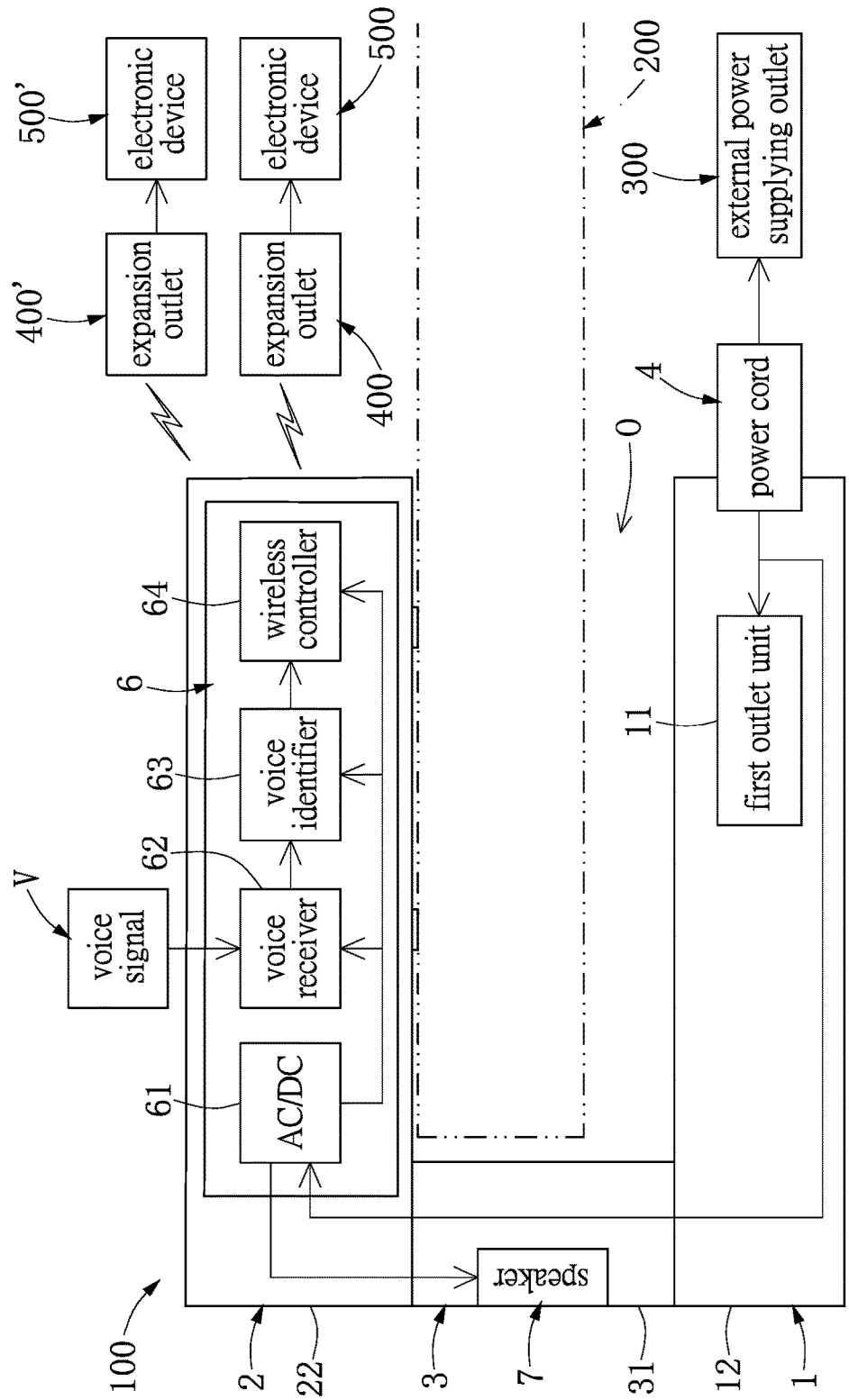
FIG. 15 is a third schematic view showing the outlet device according to the fourth embodiment of the present disclosure.

Reference is made to FIGS. 13 to 15, which illustrate a fourth embodiment of the present disclosure. The difference between the fourth embodiment and the above embodiments is disclosed as follows.

As shown in FIGS. 13 and 14, the outlet device 100 in the present embodiment can be provided with an outlet unit arranged on at least one of the counterweight portion 1 and the hanging portion 2. The figures of the present embodiment show the outlet unit 11 arranged on the counterweight portion 1, but the present disclosure is not limited thereto. Moreover, the structures and the corresponding members of the counterweight portion 1, the hanging portion 2, and the extending portion 3 in the present disclosure can be interchanged or be adjusted according to designer demands.

Moreover, the outlet device 100 further includes a voice controlling module 6, and the voice controlling module 6 in the present embodiment is installed in the hanging portion 2 and is arranged outside the U-shaped hanging slot O, but the present disclosure is not limited thereto. In other embodiments of the present disclosure, the voice controlling module 6 can be installed in at least one of the counterweight portion 1, the hanging portion 2, and the extending portion 3.

Specifically, the voice controlling module 6 includes an AC/DC convertor 61, a voice receiver 62, a voice identifier 63, and a wireless controller 64. An end of the power cord 4 is connected to the counterweight portion 1 and is electrically connected to the outlet unit 11 and the AC/DC convertor 61, and the other end of the power cord 4 is used for detachably inserting into an external power supplying outlet 300. Thus, the power cord 4 can transmit electricity from the external power supplying outlet 300 to the outlet unit 11 and the AC/DC convertor 61. In addition, in other embodiments of the present disclosure, the power cord 4 can be omitted or can be replaced by other components (e.g., plug terminals).

Moreover, the outlet device 100 in the present embodiment is cooperated with (or includes) a plurality of expansion outlets 400, 400', and the voice controlling module 6 is wirelessly connected to the expansion outlets 400, 400' through a local area network (as shown in FIG. 13), an internet I (as shown in FIG. 14), or Bluetooth (not shown).

The AC/DC convertor 61 is electrically connected to the power cord 4, the voice receiver 62, the voice identifier 63, and the wireless controller 64, so that DC electricity converted by the AC/DC convertor 61 can be transmitted to the voice receiver 62, the voice identifier 63, and the wireless controller 64.

In addition, the voice controlling module 6 in the present embodiment is provided with the AC/DC convertor 61, but the present disclosure is not limited thereto. In other embodiments of the present disclosure, if the outlet unit 11 includes a DC power outlet and a corresponding AC/DC convertor, the voice controlling module 6 and the DC power outlet can be provided to cooperate with the same AC/DC convertor, that is to say, the voice controlling module 6 can be cooperated with (i.e., electrically connected to) the AC/DC convertor of the outlet unit 11.

The voice receiver 62 is installed to the second case 22, and the voice receiver 62 in the present embodiment is partially exposed from the second case 22 for clearly receiving a voice signal V (e.g., a user's dictation), but the present disclosure is not limited thereto. For example, in other embodiments of the present disclosure, the voice receiver 62 can be arranged in the second case 22 entirely, and the second case 22 has at least one thru-hole corresponding in position to the voice receiver 62.

The voice identifier 63 is electrically connected to the voice receiver 62 for identifying the voice signal V received from the voice receiver 62. The wireless controller 64 is electrically connected to the voice identifier 63 and is wirelessly connected to the expansion outlets 400, 400'. Thus, the voice identifier 63 is to identify the voice signal V received from the voice receiver 62, thereby opening or closing the expansion outlets 400, 400' by the wireless controller 64.

For example, each of the expansion outlets 400, 400' is provided for enabling at least one electronic device 500, 500' (e.g., a TV, an audio, or other household appliances) to insert thereinto, and the each of the expansion outlets 400, 400' can provide electricity for operating the corresponding electronic device 500, 500'. When the voice receiver 62 receives a user's dictation (i.e., the voice signal V, such as: turn on or turn off), the voice identifier 63 is operated to identify the voice signal V and then transmits an identification result to the wireless controller 64, so that the wireless controller 64 will instruct the expansion outlets 400, 400' whether to supply electricity to the corresponding electronic devices 500, 500' or not according to the user's dictation. That is to say, the voice identifier 63 is to identify the voice signal V received from the voice receiver 62, thereby turning on or turning off the corresponding electronic devices 500, 500' by the wireless controller 64.

In addition, the expansion outlets 400, 400' can be respectively identified according to different voice signals (not shown), and the voice identifier 63 is to distinguish the voice signals from each other. Thus, the voice identifier 63 is to identify the voice signal V received from the voice receiver 62, thereby opening or closing one of the expansion outlets 400, 400' corresponding to the received voice signal V by the wireless controller 64.

For example, when the voice receiver 62 receives a user's dictation (i.e., the voice signal V, such as: opening the expansion outlet 400'), the voice identifier 63 is operated to identify the voice signal V and then transmits an identification result to the wireless controller 64, so that the wireless controller 64 will instruct the expansion outlet 400' whether to supply electricity to the corresponding electronic device 500' or not according to the user's dictation.

As shown in FIG. 15, the outlet device 100 in the present embodiment can further include a speaker 7 installed on at least one of the hanging portion 2 and the extending portion 3 (i.e., FIG. 15 shows the speaker 7 installed on the hanging portion 2, but the present disclosure is not limited thereto). The speaker 7 is electrically connected to the AC/DC convertor 61 for receiving DC electricity from the AC/DC convertor 61. The speaker 7 is electrically connected to the voice controlling module 6 (i.e., the wireless controller 64) for being controlled by the voice controlling module 6.

Moreover, the voice controlling module 6 is configured to control volume of the speaker 7 according to the voice signal V received from the voice receiver 62. For example, when the voice receiver 62 receives a user's dictation (i.e., the voice signal V, such as: ramping volumes up, ramping volumes down, or mute), the voice identifier 63 is operated to identify the voice signal V and then transmits an identification result to the wireless controller 64, so that the wireless controller 64 will instruct the speaker 7 to ramp volumes up, to ramp volumes down, or to mute according to the user's dictation.

[Fifth Embodiment]

Figure 16:
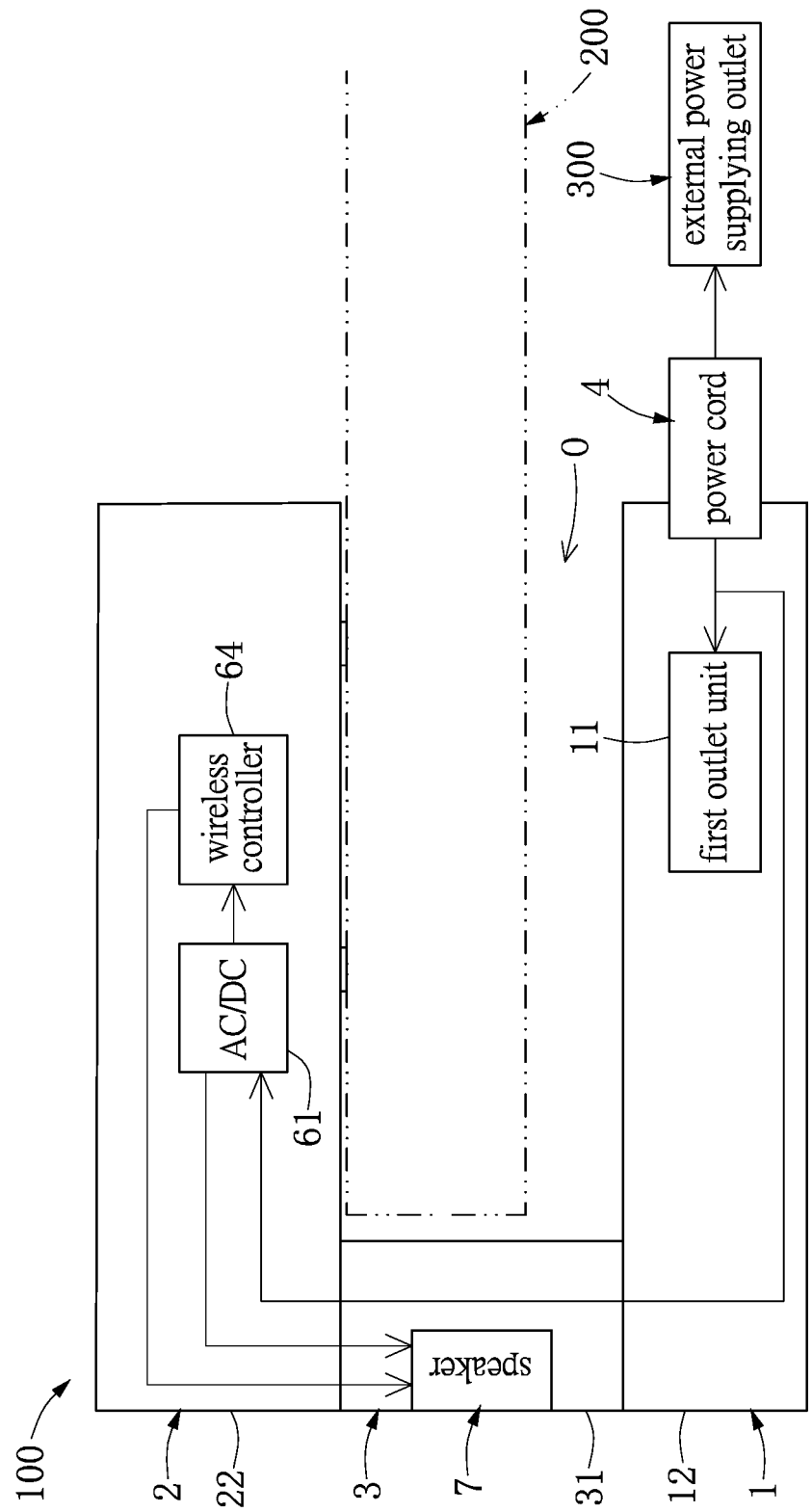
FIG. 16 is a schematic view showing the outlet device according to a fifth embodiment of the present disclosure.
Figure 17:
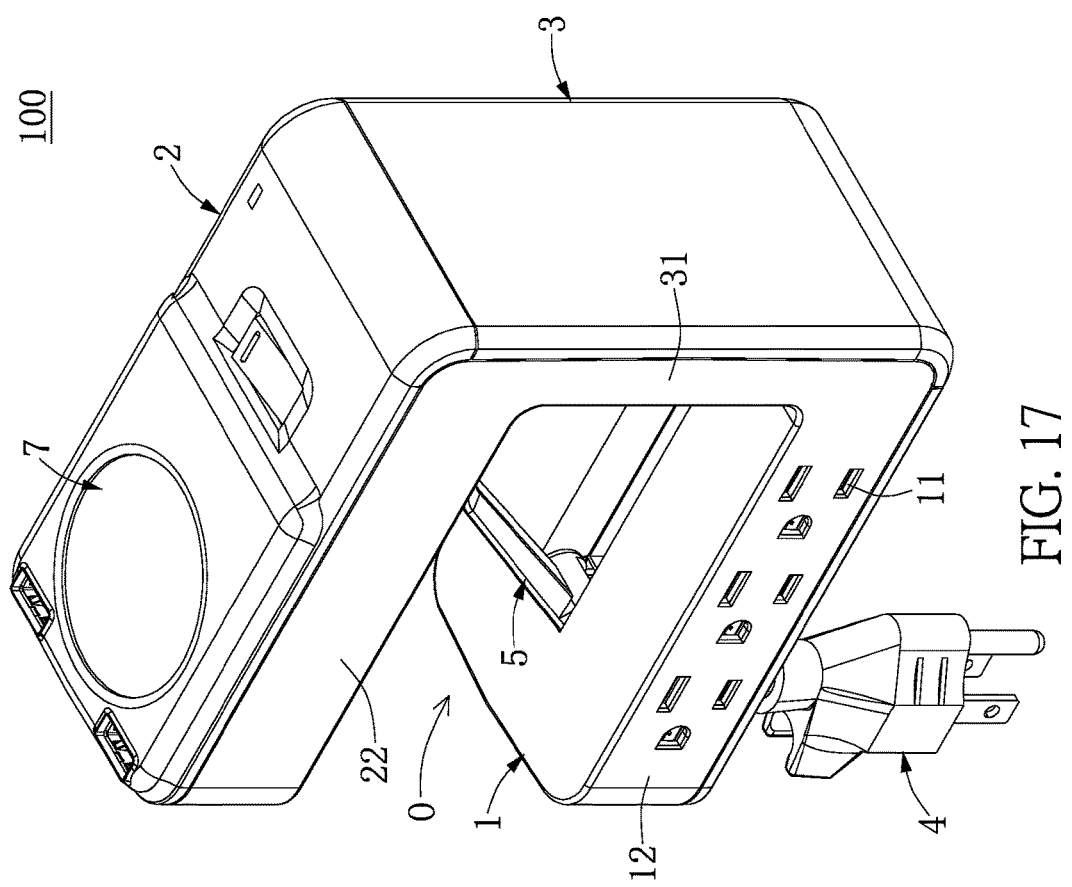
FIG. 17 is a perspective view showing the outlet device according to the fifth embodiment of the present disclosure.

Reference is made to FIGS. 16 and 17, which illustrate a fifth embodiment of the present disclosure. The difference between the fifth embodiment and the above embodiments is disclosed as follows.

The outlet device 100 in the present embodiment does not include the voice controlling module 6 disclosed in the fourth embodiment. Specifically, the outlet device 100 of the present embodiment further includes a speaker 7, an AC/DC convertor 61, and a wireless controller 64 with respect to the outlet device 100 disclosed in the first to third embodiments.

The speaker 7, the AC/DC convertor 61, and the wireless controller 64 can be installed to at least one of the counterweight portion 1, the hanging portion 2, and the extending portion 3, but the present disclosure is not limited thereto. As shown in FIG. 16, the speaker 7 is installed on the third case 31 of the extending portion 3, and the AC/DC convertor 61 and the wireless controller 64 are installed in the hanging portion 2. Moreover, as shown in FIG. 17, the speaker 7 is installed on the second case 22 of the hanging portion 2.

Specifically, the AC/DC convertor 61 is electrically connected to the power cord 4, the speaker 7, and the wireless controller 64, so that DC electricity converted by the AC/DC convertor 61 can be transmitted to the speaker 7 and the wireless controller 64. In addition, the outlet device 100 in the present embodiment is provided with the AC/DC convertor 61, but the present disclosure is not limited thereto. In other embodiments of the present disclosure, if the outlet unit 11 includes a DC power outlet and a corresponding AC/DC convertor, the outlet device 100 can use the AC/DC convertor of the outlet unit 11, so that the outlet device 100 can be provided without adding the AC/DC convertor 61.

Moreover, the speaker 7 is electrically connected to (i.e., wirelessly connected to) the wireless controller 64 for being controlled by the wireless controller 64. The wireless controller 64 is configured to control volume of the speaker 7 by receiving an external signal from an internet, a local area network, or Bluetooth.

[The Effects of the Embodiments]

In summary, the outlet device of the first to third embodiments of the present disclosure can satisfy a condition where an outlet on the plate and an outlet under the plate are needed at the same time by disposing the hanging portion on the plate to provide the first outlet unit under the plate and the second outlet unit above the plate.

Moreover, the outlet device of the present disclosure can be firmly hung on a plate, which may have different thicknesses, by forming the limiting structure in the U-shaped hanging slot and using the limiting structure to abut against the plate.

In addition, the connection of the extending portion and the counterweight portion can be a movable connection, so that the outlet device of the present disclosure can be applied to different usage environments and can satisfy user needs.

The outlet device of the fourth and fifth embodiments of the present disclosure is provided to wirelessly control an electronic device or a speaker (i.e., the electronic device is controlled by the voice controlling module, or the speaker is controlled by the wireless controller), thereby increasing the value added of the outlet device. Moreover, the voice controlling module of the outlet device can be wirelessly connected to the expansion outlets through an internet or a local area network, such that a user can control the expansion outlets by speaking to the voice controlling module. In addition, the wireless controller of the outlet device can be used to control volume of the speaker, thereby further increasing the value added of the outlet device.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. An outlet device for being hung on a plate, comprising:
a counterweight portion including an outlet unit;
a hanging portion arranged distant from the counterweight portion;
an extending portion having two opposite ends respectively connected to the counterweight portion and the hanging portion, wherein a free end of the hanging portion is arranged distant from the extending portion by a lateral distance, the extending portion has a width parallel to the lateral distance, and the width is less than or equal to the lateral distance;
a voice controlling module including a voice receiver installed to the hanging portion for receiving a voice signal, wherein the voice controlling module is configured to control an electronic device according to the voice signal received from the voice receiver; and
a power cord electrically connected to the outlet unit and the voice controlling module, wherein the power cord has an end connected to the counterweight portion and an opposite end used for detachably inserting into an external power supplying outlet,
wherein when the outlet device is applied to the plate, the counterweight portion is arranged under the plate and the hanging portion is arranged on the plate, and the hanging portion remains hung on the plate by using a weight distribution of the outlet device, thereby maintaining the outlet device in a static balance state.

2. The outlet device as claimed in claim 1, wherein the counterweight portion includes a first case, the outlet unit is disposed in the first case, the hanging portion includes a second case, the voice receiver is arranged in the second case, the extending portion includes a third case, the third case has a first end and an opposite second end, and the first end and the second end are respectively and perpendicularly connected to the first case and the second case.

3. The outlet device as claimed in claim 2, wherein the first end and the second end of the third case are integrally connected to the first case and the second case, and the first case, the second case, and the third case jointly form a U-shaped hanging slot for receiving a part of the plate, wherein the voice controlling module is arranged outside the U-shaped hanging slot.

4. The outlet device as claimed in claim 1, further comprising a plurality of expansion outlets spaced from the counterweight portion, the hanging portion, and the extending portion, wherein the voice controlling module is wirelessly connected to the expansion outlets, for controlling at least one of the expansion outlets according to the voice signal received from the voice receiver.

5. The outlet device as claimed in claim 4, wherein the voice controlling module includes:
a voice identifier electrically connected to the voice receiver, wherein the expansion outlets are respectively identified according to different voice signals, and the voice identifier is to distinguish the voice signals from each other; and
a wireless controller electrically connected to the voice identifier and wirelessly connected to the expansion outlets, wherein the voice identifier is to identify the voice signal received from the voice receiver, thereby opening or closing one of the expansion outlets corresponding to the received voice signal by the wireless controller.

6. The outlet device as claimed in claim 1, further comprising a speaker installed on the hanging portion, wherein the voice controlling module includes an AC/DC convertor electrically connected to the power cord, the voice receiver, and the speaker, and the voice controlling module is configured to control volume of the speaker according to the voice signal received from the voice receiver.

7. An outlet device for being hung on a plate, comprising:
a counterweight portion;
a hanging portion arranged distant from the counterweight portion, wherein at least one of the counterweight portion and the hanging portion is provided with an outlet unit;
an extending portion having two opposite ends respectively connected to the counterweight portion and the hanging portion; and
a voice controlling module including a voice receiver installed in the hanging portion or the extending portion for receiving a voice signal, wherein the voice controlling module is configured to control an electronic device according to the voice signal received from the voice receiver,
wherein when the outlet device is applied to the plate, the counterweight portion is arranged under the plate and the hanging portion is arranged on the plate, and the hanging portion remains hung on the plate by using a weight distribution of the outlet device thereby maintaining the outlet device in a static balance state.

8. The outlet device as claimed in claim 7, wherein a free end of the hanging portion is arranged distant from the extending portion by a lateral distance, the extending portion has a width parallel to the lateral distance, and the width is less than or equal to the lateral distance.

9. The outlet device as claimed in claim 7, wherein the voice controlling module includes:
a voice identifier electrically connected to the voice receiver; and
a wireless controller electrically connected to the voice identifier and used for wirelessly connecting to the expansion outlets, wherein the voice identifier is to distinguish the voice signals from each other, the voice identifier is to identify the voice signal received from the voice receiver, thereby opening or closing one of the expansion outlets corresponding to the received voice signal by the wireless controller.

* * * * *